(12) United States Patent
Takamura et al.

(10) Patent No.: US 8,252,422 B2
(45) Date of Patent: Aug. 28, 2012

(54) HYBRID SILICON WAFER AND METHOD OF PRODUCING THE SAME

(75) Inventors: Hiroshi Takamura, Ibaraki (JP); Ryo Suzuki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 53 days.

(21) Appl. No.: 12/832,120

(22) Filed: Jul. 8, 2010

(65) Prior Publication Data

US 2012/0009373 A1 Jan. 12, 2012

(51) Int. Cl.
| | |
|---|---|
| B32B 9/04 | (2006.01) |
| B32B 13/04 | (2006.01) |
| B32B 3/02 | (2006.01) |
| D04H 1/20 | (2006.01) |
| B29B 9/06 | (2006.01) |
| B29C 59/00 | (2006.01) |
| B29C 67/00 | (2006.01) |

(52) U.S. Cl. ....... 428/446; 428/64.1; 264/112; 264/118; 264/122; 264/125

(58) Field of Classification Search ................. 428/64.1, 428/446; 264/112, 118, 122, 125
See application file for complete search history.

(56) References Cited

U.S. PATENT DOCUMENTS

| | | | |
|---|---|---|---|
| 4,921,026 A | 5/1990 | Flagella et al. | |
| 5,382,549 A | 1/1995 | Ohshima et al. | |
| 6,245,161 B1 * | 6/2001 | Henley et al. | ................. 148/33.4 |
| 7,259,077 B2 | 8/2007 | Degani et al. | |
| 7,635,868 B2 | 12/2009 | Kojima et al. | |
| 2003/0124820 A1 * | 7/2003 | Johnsgard et al. | ............ 438/482 |
| 2008/0122042 A1 | 5/2008 | Goldstein et al. | |
| 2009/0263626 A1 | 10/2009 | Fujiwara | |
| 2010/0016144 A1 | 1/2010 | Suzuki et al. | |

(Continued)

FOREIGN PATENT DOCUMENTS

| | | |
|---|---|---|
| JP | 05-229812 A | 9/1999 |
| JP | 2004-289065 A | 10/2004 |
| JP | 2005-132671 A | 5/2005 |

(Continued)

OTHER PUBLICATIONS

Chau Chun Lu et al. ("Modeling and Optimization of Monolithic Polycrystalline Resistors", IEEE Transactions on Electron Devices, vol. ED-28, No. 7, 1981, pp. 818-830.*

Primary Examiner — Jonathan Langman
(74) Attorney, Agent, or Firm — Howson & Howson LLP

(57) ABSTRACT

Provided is a hybrid silicon wafer made of a wafer comprised primarily of two or more types of concentric single-crystal silicon or polycrystalline silicon prepared by mutually integrating one in a molten state and another in a solid state, and having specific resistances that differ by two orders of magnitude or more. Additionally provided is a method of manufacturing a hybrid silicon wafer, wherein high specific resistance silicon or an ingot comprised primarily of silicon is disposed at a central portion or a decentered position in a crucible, a nugget or powdered silicon having a specific resistance that is lower by two orders of magnitude or more than the ingot is filled in a void part around the ingot in the crucible, the nugget or powdered silicon is selectively melted and integrated with the ingot to form a complex, and a wafer shape is cut out therefrom. The provided hybrid silicon wafer comprises the functions of both a polycrystalline silicon wafer and a single-crystal wafer, or two or more polycrystalline silicon wafers having different functions.

12 Claims, 1 Drawing Sheet

U.S. PATENT DOCUMENTS

2010/0187661 A1 7/2010 Suzuki et al.
2010/0330325 A1 12/2010 Suzuki et al.
2011/0123795 A1 5/2011 Satoh et al.
2012/0009374 A1 1/2012 Takamura et al.

FOREIGN PATENT DOCUMENTS

WO 2009/014961 A1 1/2009
WO 2010/004863 A1 1/2010

* cited by examiner

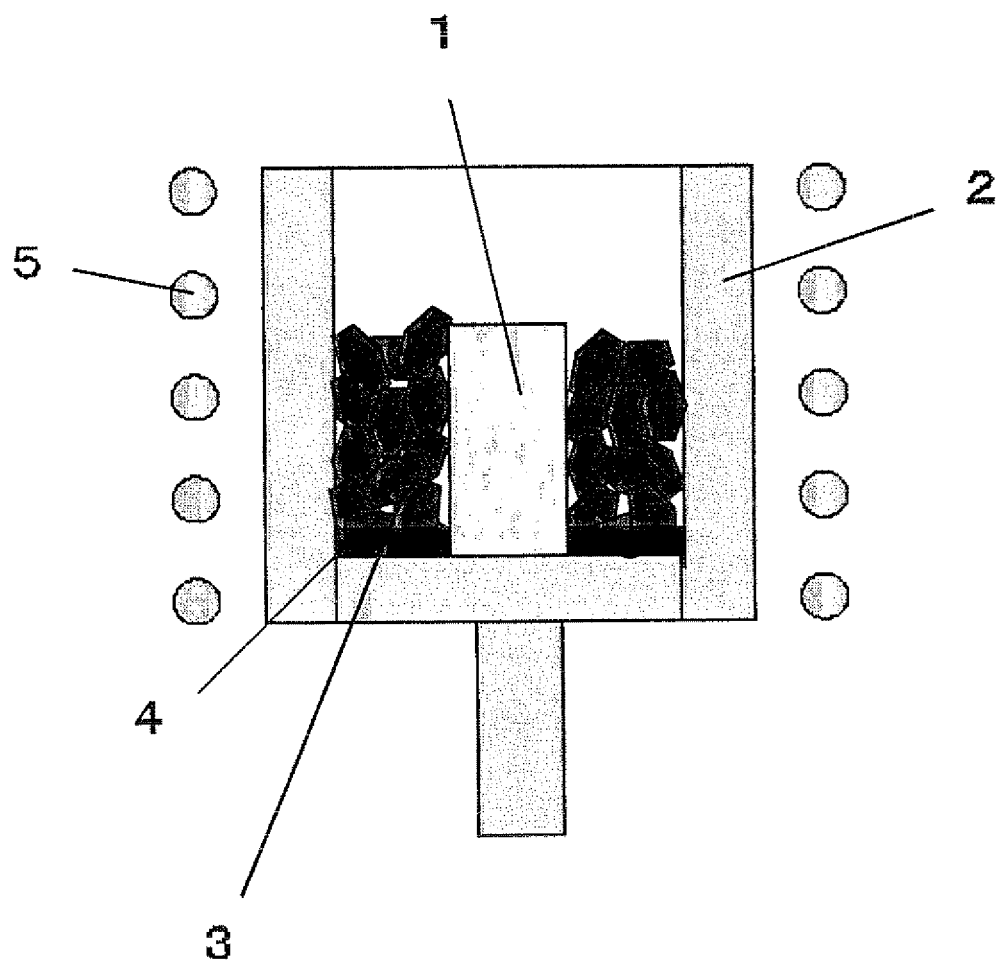

HYBRID SILICON WAFER AND METHOD OF PRODUCING THE SAME

BACKGROUND OF THE INVENTION

1. Field of the Invention

The present invention relates to a hybrid silicon wafer comprising the functions of both a polycrystalline silicon wafer and a single-crystal wafer, and to the method of manufacturing such a hybrid silicon wafer.

2. Description of the Related Art

In the silicon semiconductor manufacturing process, a wafer prepared based on single-crystal growth is primarily used. This single-crystal silicon wafer has increased in size with the times, and it is anticipated that the inner diameter will become ϕ400 mm or larger in the near future. In addition, a so-called mechanical wafer for testing is now required in order to establish the apparatus and peripheral technology necessary for the semiconductor manufacturing process.

Generally speaking, since this kind of mechanical wafer is subject to fairly high precision testing, it needs to possess characteristics that are similar to the mechanical physicality of single-crystal silicon. Thus, conventionally, although it was to be used for testing, in reality the single-crystal silicon wafer was being used as is. However, since a single-crystal silicon wafer having an inner diameter of ϕ400 mm or larger is extremely expensive, an inexpensive wafer having characteristics that are similar to single-crystal silicon is in demand.

Meanwhile, as a component of such semiconductor manufacturing equipment, a proposal has also been made for using a sputtering target formed from a rectangular or disk-shaped silicon plate. The sputtering method is being used as a means for forming thin films, and there are several sputtering methods including the bipolar DC sputtering method, radio frequency sputtering method, magnetron sputtering method and the like, and thin films of various electronic parts are being formed using the sputtering characteristics unique to the respective methods.

This sputtering method is a method that faces a substrate as the anode and a target as the cathode, and generates an electrical field by applying a high voltage between the foregoing substrate and target under an inert gas atmosphere. Here, the ionized electrons and inert gas collide to form a plasma, the cations in the plasma collide with the target surface to hammer out the target constituent atoms, and the discharged atoms adhere to the opposite substrate surface so as to form a film.

A polycrystalline silicon sintered compact is proposed for this kind of sputtering target, and this sintered compact target is demanded of considerable thickness and of being large-size rectangular or disk-shaped in order to improve the deposition efficiency. Moreover, a proposal has also been made for using this polycrystalline silicon sintered compact as a board for retaining the single-crystal silicon wafer. Nevertheless, polycrystalline silicon entails significant problems in that the sinterability is inferior, the obtained products have low density, and the mechanical strength is low.

In light of the above, in order to improve the characteristics of the foregoing silicon sintered compact, proposed is a silicon sintered compact formed by compression-molding and sintering silicon powder obtained by being heated and deoxidized under reduced pressure and within a temperature range that is 1200° C. or higher and less than the melting point of silicon, and setting the crystal grain size of the sintered compact to be 100 μm or less (for instance, refer to Japanese Patent No. 3342898).

If the thickness of the silicon sintered compact manufactured as described above is thin; for instance, 5 mm or less, the density will relatively increase and the strength will also increase, however, if the thickness becomes thicker, the density will continue to be a low density (less than 99%), and the mechanical strength will also deteriorate. Thus, it is a problem that manufacturing a large-size rectangular or disk-shaped silicon sintered compact is not possible.

In light of the foregoing circumstances, the present applicant previously proposed a silicon sintered compact and its production method in which the average crystal grain size is 50 μm or less and the relative density is 99% or more (refer to Japanese Patent No. 3819863).

Although this silicon sintered compact possesses numerous advantages including high density and high mechanical strength, the further improvement of these characteristics is being demanded, and the applicant filed a patent application relating to technology that improved the foregoing points.

Since a wafer using the foregoing silicon sintered compact has similar mechanical properties as single-crystal silicon, it can be used as a dummy wafer for the transport system of semiconductor manufacturing equipment or the development of robotics. In addition, the application of an SOI wafer as a base substrate is also being considered.

Nevertheless, these are all polycrystalline silicons made from a silicon sintered compact, and although there are numerous points that are similar to the physical properties of a single crystal, they do not possess the function as the single crystal itself, and there is a fundamental problem in that they cannot be used for process testing such as deposition experiments.

Moreover, there is also a proposal of manufacturing a high quality polycrystalline silicon in substitute for single-crystal silicon (refer to Japanese Patent Published Unexamined Application No. 2005-132671). Nevertheless, polycrystalline silicon has a drawback in that, no matter what kind of devisal is made, its characteristics will be inferior to single-crystal silicon. As a means for overcoming this drawback, M. Goldstein of Intel and others proposed a wafer in which single-crystal silicon is embedded in polycrystalline silicon (refer to US Patent Publication No. 2008/0122042).

Moreover, the present applicant previously filed an application for an invention which uses silicon prepared with the sintering method at the polycrystalline portion of the wafer in which single-crystal silicon is embedded in the foregoing polycrystalline silicon. However, the sintered silicon contains large amounts of gas components such as oxygen and carbon, and since precipitates of $SiO_2$ and SiC exist at the crystal grain boundary, there is a problem in that unevenness will occur during the polishing due to the difference in the polishing rate compared to the single-crystal portion (refer to International Publication No. WO2010-004863).

In light of the above, the present applicant proposed manufacturing a hybrid silicon wafer by hollowing a part of a polycrystalline silicon prepared in advance based on the unidirectional solidification/melting method, inserting a single-crystal silicon ingot into the hollowed portion, performing thermal diffusion bonding thereto in order to prepare a complex of a polycrystalline silicon and a single-crystal silicon ingot, and slicing the complex to manufacture a hybrid silicon wafer (refer to Japanese Patent Application No. 2009-255016).

Although this method is less costly than a wafer in which the entire surface is formed of a single crystal, it is necessary to strictly control the tolerance of the hollowing process of the polycrystalline and the edge processing of the single-crystal to be embedded, and there is a problem in that this led to the increase in production costs.

SUMMARY OF THE INVENTION

As described above, the shape of a single-crystal wafer that is used in the LSI process is becoming a greater diameter with the times, and a single-crystal wafer having a diameter of 400 mm or more is becoming standard. Nevertheless, a single-crystal wafer having a diameter of 400 mm or more is extremely expensive, and consequently its dummy wafer is also expensive, and costs of the LSI process will thereby increase. Moreover, with a single-crystal silicon wafer of a large diameter; for instance, a diameter of 400 mm or more, there is concern that the cracks of the single-crystal cleavage surface will increase and the production yield will deteriorate compared to a conventional 300 mm wafer.

Thus, the present invention inexpensively provides a so-called hybrid wafer combining polycrystalline silicon and single-crystal silicon by using a general-purpose 300 mm single-crystal and which can be applied to a dummy wafer of 400 mm or more, as well as improves the production yield by improving the strength of the dummy wafer. Consequently, the present invention is able to provide a hybrid silicon wafer comprising the functions of both a polycrystalline silicon wafer and a single-crystal silicon wafer.

Although a sintered silicon may be used at the polycrystalline silicon portion of the hybrid wafer, since there is a large amount of gas components such as C and O compared to a melted Si ingot and SiC and $SiO_2$ of high hardness precipitate at the crystal grain boundary, the polishing rate is slow in the mirror polishing process compared to the single-crystal silicon portion, and there is a problem in that unevenness will occur in the thickness of the single-crystal silicon portion and the polycrystalline silicon portion. Thus, an object of this invention is to provide a hybrid silicon wafer capable of overcoming the problems, and provide it more inexpensively.

In order to achieve the foregoing object, the present inventors discovered that a hybrid silicon wafer comprising the functions of both a polycrystalline silicon wafer and a single-crystal silicon wafer can be obtained by integrating a polycrystalline silicon and single-crystal silicon, in which their mechanical strength has been improved, in a state where one is molten and another is an ingot (solid).

Based on the foregoing discovery, the present invention provides a "hybrid silicon wafer" according to 1) to 5) below.
1) A hybrid silicon wafer made of a wafer comprised primarily of two or more types of single-crystal silicon or polycrystalline silicon prepared by mutually integrating one in a molten state and another in a solid state, and having specific resistances that differ by two orders of magnitude or more.
2) The hybrid silicon wafer according to 1) above, wherein the single-crystal silicon is disposed in and integrated with the polycrystalline silicon, and has a specific resistance that differs by two orders of magnitude or more.
3) The hybrid silicon wafer according to 1) or 2) above, wherein its central portion is a high specific resistance silicon wafer having a single-crystal crystal structure, and a wafer of portions other than the single-crystal is a low specific resistance polycrystalline silicon wafer.
4) The hybrid silicon wafer according to any one of 1) to 3) above, wherein the low specific resistance silicon wafer or wafer comprised primarily of silicon has a resistance of $1 \times 10^{-6}$ to $0.1$ $\Omega \cdot cm$, and the high specific resistance silicon wafer or wafer comprised primarily of silicon has a resistance of $0.1$ to $1 \times 10^5$ $\Omega \cdot cm$.
5) The hybrid silicon wafer according to any one of 1) to 4) above, wherein the wafer is disk-shaped, and the overall diameter of the wafer is 400 mm or more.

The present invention additionally provides a "method of manufacturing a hybrid silicon wafer" according to 6) to 8) below.
6) A method of manufacturing a hybrid silicon wafer, wherein high specific resistance silicon or an ingot comprised primarily of silicon is disposed at a central portion in a crucible, a nugget or powdered silicon having a specific resistance that is lower by two orders of magnitude or more than the ingot is filled in a void part around the ingot in the crucible, the nugget or powdered silicon is selectively melted and integrated with the ingot to form a complex, and a wafer shape is cut out therefrom.
7) The method of manufacturing a hybrid silicon wafer according to 6) above, wherein the nugget or powdered silicon having a specific resistance that is lower by two orders of magnitude or more than the ingot is selectively melted based on induction heating.
8) The method of manufacturing a hybrid silicon wafer according to 6) or 7) above, wherein the diameter of the complex is 400 mm or more.

As a result of the above, it is possible to provide a hybrid silicon wafer comprising the mutual functions of two or more types of polycrystalline silicon wafers having mutually differing characteristics, or the functions of both a polycrystalline silicon wafer and a single-crystal wafer. Thus, the present invention yields a significant effect of simultaneously possessing the characteristics and function as a single-crystal wafer, and the characteristics and function of two or more types of polycrystalline silicon wafers.

The polycrystalline silicon wafer to become the support base of the hybrid silicon wafer needs to be enlarged and its strength must be improved. However, the bonding strength of a hybrid silicon wafer that was integrated from a molten state can be further improved.

The polycrystalline silicon wafer of the hybrid silicon wafer according to the present invention comprises characteristics that are similar to the mechanical properties of single-crystal silicon that is used as a mechanical wafer, and possesses the capability of monitoring the semiconductor manufacture process at the single-crystal portion. Namely, the present invention can be used as a wafer for monitoring particles and lithography in addition to being used for the transport system of semiconductor manufacturing equipment or the development of robotics.

In addition, since polycrystalline silicon can be formed by melting silicon around a single-crystal ingot, a large ingot can be prepared easily. Moreover, since the boundary faces are mutually integrated, a hybrid silicon wafer can be manufactured by slicing the prepared complex.

As described above, the hybrid silicon wafer comprising the mutual functions of polycrystalline silicon wafers or the functions of both a polycrystalline silicon wafer and a single-crystal wafer is able to considerably improve the production yield and reduce production costs compared to an independent single-crystal wafer of the same size. In addition, the present invention yields a significant effect of being able to prepare an inexpensive dummy silicon wafer of 400 mm or more by using polycrystalline silicon blocks for commercialized solar batteries and waste materials, and a 300 mm single-crystal silicon ingot.

Furthermore, a dummy silicon wafer prepared by using a polycrystalline silicon ingot having a purity of 6N or higher is characterized in that it will not contaminate the process unit or other components even when it is introduced into the process unit. Moreover, since the polycrystalline silicon is melted and bonded around the single crystal with a cleavage surface, a significant effect is yielded in that the strength of the wafer can be increased, and the deterioration in the production yield caused by cracks in the cleavage of the wafer can be prevented.

BRIEF DESCRIPTION OF THE DRAWINGS

FIG. 1 is a schematic explanatory diagram showing an example of the manufacture of the hybrid wafer of the present invention using a skull melting furnace.

DESCRIPTION OF THE PREFERRED EMBODIMENTS

The hybrid silicon wafer of the present invention is a discoid wafer, and is made of two or more types of silicons or wafers comprised primarily of silicon having specific resistances that show different characteristics. With silicon, the resistance will increase as the purity becomes higher, and a commercially available single-crystal wafer has a resistance of roughly 5 to 20 $\Omega \cdot cm$.

Meanwhile, a polycrystalline silicon doped with 0.01 at % of B (boron) has a resistance of roughly $1 \times 10^{-2}$ $\Omega \cdot cm$, and a silicon doped with 2 at % of boron has a resistance of roughly $1 \times 10^{-4}$ $\Omega \cdot cm$. In addition, as the dopant, P (phosphorus) and As (arsenic) may be considered in addition to boron. These elements are able to obtain the same effect as B (boron).

By way of reference, with other materials; for instance, the resistance will be roughly $4.3 \times 10^{-5}$ $\Omega \cdot cm$ with titanium as the dopant and the resistance will be roughly $1.7 \times 10^{-8}$ $\Omega \cdot cm$ with copper as the dopant.

Upon manufacturing the foregoing hybrid silicon wafer, foremost, high specific resistance silicon or an ingot comprised primarily of silicon is disposed at a central portion or a decentered position in a crucible, and a nugget or powdered silicon having a specific resistance that is lower by two orders of magnitude or more than the ingot is filled in a void part around the ingot in the crucible.

Subsequently, the raw materials in the crucible are heated with the induction heating method. In normal circumstances, a skull melting furnace as shown in FIG. 1 is used for melting the raw materials. The coil disposed around the melting furnace causes the magnetic field to pass through the crucible and induces heat to the conductive material, and the raw materials inside the furnace are thereby melted with this heat. The magnetic field yields the effect of powerfully stirring the molten metal.

Since the side face of the molten metal pool is supported by magnetic force and will not physically come into contact with the side wall of the melting furnace, a segment of the crucible will not be subject to an electrical short circuit, and it is also possible to prevent the mixture of inclusions from the crucible.

FIG. 1 shows an example where a high purity single-crystal silicon (high resistance) ingot is introduced at the central portion, and a nugget or powdered silicon raw material as the raw material with a lower resistance than the single-crystal silicon is introduced around the ingot. Here, it is necessary to use a silicon raw material having a specific resistance that differs by two orders of magnitude or more compared to the single-crystal silicon disposed at the central portion as described above.

In the foregoing case, since the objective is to manufacture a wafer having a structure in which the polycrystalline silicon is integrated around the single-crystal silicon, a raw material to which 2 at % of boron is added to lower the resistance may be used as the silicon raw material having a specific resistance that differs by two orders of magnitude or more.

Consequently, since the inductive current will not flow to the high resistance single-crystal silicon, the heating will be insufficient and it will not melt. Meanwhile, the low resistance nugget or powdered silicon raw material is selectively melted and solidified, and subsequently obtained is a columnar ingot in which the polycrystalline silicon became solidified and integrated around the single-crystal silicon.

As a result of slicing this integrated columnar complex, it is possible to obtain a discoid hybrid silicon wafer in which the inside is single-crystal, and in which the polycrystal is integrated around the single crystal.

As the silicon raw material to be introduced into the crucible for forming the polycrystal, normally a nugget, a block mill end or powdered silicon raw material is used. Although there is no need to specify the shape of the raw material, it could be said that a thumb-sized nugget is preferable from the perspective of flowability of the inductive current and ease of filling into the crucible.

In the foregoing explanation, a case was described where a high purity single-crystal silicon (high resistance) ingot is introduced at the central portion and a nugget or powdered silicon raw material as the raw material with a lower resistance than the single-crystal silicon is introduced at the outer periphery thereof. However, it is also possible to introduce the single-crystal silicon (high resistance) ingot at a decentered position in the crucible, and introduce the nugget or powdered silicon raw material as the raw material with a lower resistance than the single-crystal silicon at the peripheral part thereof. In the foregoing case, since the single-crystal portion will be position from the center toward the edge, the obtained wafer can be used to monitor that area.

Here, similarly, the inductive current will not flow to the high resistance single-crystal silicon. Meanwhile, the low resistance nugget or powdered silicon raw material is selectively melted and solidified, and subsequently obtained is a columnar ingot in which the polycrystalline silicon became solidified and integrated inside the single-crystal silicon.

By slicing this integrated columnar complex, it is possible to obtain a discoid hybrid silicon wafer in which the polycrystal and single-crystal are integrated.

Although the foregoing explanation was based on the premise that it is essential to prepare a single-crystal silicon ingot in advance, it should be easy to understand that a discoid hybrid silicon wafer can also be manufactured only from polycrystalline silicon as a matter of course.

In the foregoing case, as the plurality of polycrystalline raw materials, silicon raw materials having specific resistances that differ by two orders of magnitude or more are simply used. The present invention covers all of the above.

It is thereby possible to obtain a hybrid silicon wafer in which the low specific resistance silicon wafer or the wafer comprises primarily of silicon has a resistance of $1 \times 10^{-6}$ to $0.1$ $\Omega \cdot cm$, and the high specific resistance silicon wafer or the wafer comprises primarily of silicon has a resistance of $0.1$ to $1 \times 10^{5}$ $\Omega \cdot cm$.

The hybrid silicon wafer that is manufactured using a crucible will be disk-shaped, but it may also be formed in a rectangular shape or other shapes depending on how the wafer is cut out. As the discoid wafer, a wafer having an overall diameter of 400 mm or more can be obtained.

Here, the diameter of the ingot complex needs to be 400 mm or more, but there is no limitation to this shape, and the shape may be arbitrarily set.

Desirably, the hybrid silicon wafer polycrystalline silicon portion has a purity of 6N or higher excluding doped components for adjusting the resistance and gas components, the total amount of metal impurities is 1 wtppm or less, and the respective amounts of Cu, Fe, Ni, and Al in the metal impurities are 0.1 wtppm or less. Moreover, desirably, C and O as the gas components of the polycrystalline silicon portion are respectively 100 wtppm or less. A dummy silicon wafer manufactured as described above is characterized in that it will not contaminate the process unit or other components even when it is introduced into the process unit. Consequently, it is possible to increase the utility value of a disk-shaped wafer having an overall diameter or 400 mm or more.

As the polycrystalline silicon wafer to become the support base of the single-crystal silicon wafer, a large wafer can be prepared. Meanwhile, with single-crystal silicon, large-size silicon in which its inner diameter exceeds 400 mm is extremely expensive. Thus, a silicon wafer having an inner diameter of 400 mm or more can be easily prepared with a polycrystalline silicon wafer.

There is no particular limitation to the size of the single-crystal silicon to be used as a part of the hybrid silicon wafer. However, if the longest diameter of the single-crystal wafer is 50% or more of the diameter of the overall wafer, there is an advantage in that the hybrid silicon wafer can be effectively used in the testing that uses the characteristics of a single-crystal wafer.

The foregoing hybrid silicon wafer is able to effectively utilize the function as a single-crystal wafer or as a polycrystalline wafer. Not only can it be used as a mechanical wafer (or a dummy wafer), it can also be used as a test wafer of equipment testing such as deposition experiments on a single crystal. Namely, this wafer can be used for monitoring particles and monitoring lithography or the like.

Accordingly, the "hybrid silicon wafer" of the present invention is available for multipurpose utilization, and a silicon wafer comprising the foregoing characteristics did not conventionally exist.

EXAMPLES

The present invention is now explained in detail with reference to the Examples. These Examples are merely for facilitating the understanding of this invention, and the present invention shall in no way be limited thereby. In other words, various modifications and other embodiments based on the technical spirit claimed in the claims shall be covered by the present invention as a matter of course.

Example 1

As shown in FIG. 1, a single-crystal silicon ingot 1 having a specific resistance of 10 Ω·cm, diameter of 100 mm, length of 100 mm, and purity of 11N was set at the center of a water cooling copper crucible 2 having an inner diameter of 200 mm. Moreover, an amorphous polycrystalline silicon 3 (doped with 0.2 at % of boron) having a specific resistance of 0.001 Ω·cm and an average size of 30 mm was filled around the foregoing ingot up to a height of roughly 80 mm.

The atmosphere (inside the furnace) around the crucible was controlled to be a vacuum, and an alternating current of 10 kHz was flowed to an induction heating coil 5. Here, the induction heating was preferentially performed to the low resistance silicon to which the inductive current flowed, and only the nugget-shaped polycrystalline silicon 4 placed around the single-crystal ingot was selectively melted.

Moreover, when comparing the physical properties of silicon with Cu, there are the following characteristics; namely, the thermal conductivity is low and the specific heat is high, and the single-crystal ingot that is not subject to induction heating will hardly melt.

Si: thermal conductivity 84 W/mK, specific heat 678 J/kg° C.
Cu: thermal conductivity 372 W/mK, specific heat 419 J/kg° C.

The low resistance silicon is locally heated up to roughly 1450° C. and melted. As a result of promptly cooling this while giving consideration to voids and residual stress, obtained was a pillar-shaped silicon ingot having a crystal structure up to a height of approximately 50 mm, and in which two types of silicons with different resistances were integrated.

Here, the same results were obtained regardless of whether the shape of the low resistance silicon placed around the single-crystal ingot was a powdery fine raw material or a large block waste material. However, it could be said that a thumb-sized nugget is preferable from the perspective of flowability of the inductive current and ease of filling into the crucible. With the use of polycrystalline silicon as the low resistance raw material in this Example, there was no particular problem even when a single-crystal waste material was used.

As a result of slicing this pillar-shaped ingot, it was possible to prepare a concentric discoid hybrid wafer having a single-crystal wafer at the center and a polycrystalline wafer at the periphery thereof.

Example 2

As shown in FIG. 1, a polycrystalline silicon raw material formed from two types of silicons having different resistances was used, one silicon (specific resistance of 0.1 Ω·cm and doped with 1 atppm of boron) was melted in advance to obtain an ingot 1, this ingot was similarly set at the center of the water cooling copper crucible 2, and a polycrystalline silicon 3 (doped with 2 at % of boron) nugget 3 having a specific resistance of 0.0001 Ω·cm and an average size of 20 mm was filled around the ingot up to a height of roughly 80 mm. The atmosphere (inside the furnace) around the crucible was controlled to be a vacuum, and an alternating current of 10 kHz was flowed to the induction heating coil 5.

Consequently, the induction heating was preferentially performed to the low resistance silicon, and only the nugget-shaped low resistance silicon 4 placed around the high resistance silicon ingot was selectively melted.

It was thereby possible to prepare a pillar-shaped polycrystalline silicon ingot formed from two types of silicons having different resistances.

Moreover, by slicing this pillar-shaped ingot, it was possible to prepare a concentric discoid hybrid wafer having a high resistance polycrystalline wafer at the center and a low resistance polycrystalline wafer at the periphery thereof.

Example 3

As shown in FIG. 1, a single-crystal silicon ingot 1 having a specific resistance of 2 Ω·cm, diameter of 300 mm, length of 150 mm and purity of 10N was set at the center of the water cooling copper crucible 2 having an inner diameter of 480 mm, Moreover, an amorphous polycrystalline silicon 3 (doped with 0.2 at % of boron) having a specific resistance of 0.001 Ω·cm and an average size of 30 mm was filled around the foregoing ingot up to a height of roughly 100 mm.

The atmosphere (inside the furnace) around the crucible was controlled to be a vacuum, and an alternating current of 10 kHz was flowed to the induction heating coil 5. Here, only the low resistance silicon 4 placed around the single-crystal ingot was selectively melted based on induction heating, and this was promptly cooled while giving consideration to voids and residual stress to obtain a silicon ingot having a crystal structure up to a height of approximately 80 mm, and in which two types of silicons with different resistances were integrated.

As a result of slicing this pillar-shaped ingot, it was possible to prepare a concentric discoid hybrid wafer having a high resistance single-crystal wafer at the center and a low resistance polycrystalline wafer at the periphery thereof.

INDUSTRIAL APPLICABILITY

As a result of the above, the present invention yields a significant effect of being able to provide a hybrid silicon wafer comprising the functions of both a single-crystal silicon wafer and a polycrystalline silicon wafer, or the functions of different types of polycrystalline silicon wafers.

The polycrystalline silicon wafer to become the support base of the hybrid silicon wafer can be enlarged and its strength can be improved. The polycrystalline silicon wafer of the hybrid silicon wafer according to the present invention comprises characteristics that are similar to the mechanical properties of single-crystal silicon that is used as a mechanical wafer, and possesses the capability of monitoring the semiconductor manufacture process at the single-crystal portion.

The hybrid silicon wafer comprising the functions of both a polycrystalline silicon wafer and a single-crystal wafer is able to considerably improve the production yield and reduce production costs compared to an independent single-crystal wafer, and is therefore useful as a test wafer of a deposition system or the like, or as the various components of semiconductor manufacturing equipment.

What is claimed is:

1. A hybrid silicon wafer made of a wafer comprised primarily of two or more types of single-crystal silicon or polycrystalline silicon prepared by mutually integrating one in a molten state and another in a solid state and having specific resistances that differ by two orders of magnitude or more, the two or more types of single-crystal silicon or polycrystalline silicon of the wafer extending coplanar relative to each other such that an outer one of the two or more types extends laterally from and surrounds an inner one of the two or more types and forms an outer peripheral portion of the wafer.

2. The hybrid silicon wafer according to claim 1, wherein the two or more types of single-crystal silicon or polycrystalline silicon includes single-crystal silicon disposed in, integrated with and surrounded laterally by polycrystalline silicon.

3. The hybrid silicon wafer according to claim 2, wherein a central portion of the wafer is of high specific resistance single-crystal crystal silicon, and a portion of the wafer other than the single crystal silicon is low specific resistance polycrystalline silicon.

4. The hybrid silicon wafer according to claim 3, wherein the low specific resistance polycrystalline silicon has a resistance of $1\times10^{-6}$ to 0.1 Ω·cm, and the high specific resistance single-crystal silicon has a resistance of 0.1 to $1\times10^5$ Ω·cm.

5. The hybrid silicon wafer according to claim 4, wherein the wafer is disk-shaped, and the overall diameter of the wafer is 400 mm or more.

6. The hybrid silicon wafer according to claim 1, wherein a central portion of the wafer is high specific resistance single-crystal silicon, and a portion of the wafer other than the single crystal silicon is low specific resistance polycrystalline silicon.

7. The hybrid silicon wafer according to claim 6, wherein the low specific resistance polycrystalline silicon has a resistance of $1\times10^{-6}$ to 0.1 Ω·cm, and the high specific resistance single-crystal silicon has a resistance of 0.1 to $1\times10^5$ Ω·cm.

8. The hybrid silicon wafer according to claim 1, wherein the wafer is disk-shaped, and the overall diameter of the wafer is 400 mm or more.

9. A method of manufacturing a hybrid silicon wafer, wherein high specific resistance silicon or an ingot comprised primarily of silicon is disposed at a central portion in a crucible, a nugget or powdered silicon having a specific resistance that is lower by two orders of magnitude or more than the ingot is filled in a void part around the ingot in the crucible, the nugget or powdered silicon is selectively melted and integrated with the ingot to form a complex, and a wafer shape is cut out therefrom to form a wafer comprised primarily of two or more types of single-crystal silicon or polycrystalline silicon having specific resistances that differ by two orders of magnitude or more, the two or more types of single-crystal silicon or of polycrystalline silicon of the wafer extending coplanar relative to each other such that an outer one of the two or more types extends laterally from and surrounds an inner one of the two or more types and forms an outer peripheral portion of the wafer.

10. The method of manufacturing a hybrid silicon wafer according to claim 9, wherein the nugget or powdered silicon having a specific resistance that is lower by two orders of magnitude or more than the high specific resistance silicon or ingot comprised primarily of silicon is selectively melted based on induction heating.

11. The method of manufacturing a hybrid silicon wafer according to claim 10, wherein the diameter of the complex is 400 mm or more.

12. The method of manufacturing a hybrid silicon wafer according to claim 9, wherein the diameter of the complex is 400 mm or more.

* * * * *